United States Patent
Buzon et al.

(10) Patent No.: US 9,213,067 B2
(45) Date of Patent: Dec. 15, 2015

(54) DEVICE FOR MONITORING THE VOLTAGE OUTPUT BY THE CELLS OF AN ELECTROCHEMICAL GENERATOR

(75) Inventors: Didier Buzon, Grenoble (FR); Daniel Chatroux, Teche (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 237 days.

(21) Appl. No.: 14/125,127

(22) PCT Filed: May 22, 2012

(86) PCT No.: PCT/EP2012/059468
§ 371 (c)(1),
(2), (4) Date: Feb. 26, 2014

(87) PCT Pub. No.: WO2012/168066
PCT Pub. Date: Dec. 13, 2012

(65) Prior Publication Data
US 2014/0159735 A1  Jun. 12, 2014

(30) Foreign Application Priority Data

Jun. 10, 2011 (FR) .................................. 11 55089

(51) Int. Cl.
*G01N 27/416* (2006.01)
*G01R 31/36* (2006.01)
(Continued)

(52) U.S. Cl.
CPC ...... *G01R 31/3606* (2013.01); *G01R 19/16542* (2013.01); *G01R 31/3658* (2013.01);
(Continued)

(58) Field of Classification Search
CPC ............... Y02E 60/12; G01R 31/3627; G01R 31/3662; G01R 31/3631
USPC ......................................................... 324/426
See application file for complete search history.

(56) References Cited

U.S. PATENT DOCUMENTS 5,986,434 A * 11/1999 Roy ...................... H02J 7/0091
320/128
8,294,426 B2 * 10/2012 Kosugi ............... G01R 31/3658
320/116

(Continued)

FOREIGN PATENT DOCUMENTS

| FR | 2427817 A1 | 1/1980 |
| JP | 6-233474 A | 8/1994 |
| JP | 2004-157077 A | 6/2004 |

*Primary Examiner* — Arun Williams
(74) *Attorney, Agent, or Firm* — Baker & Hostetler LLP

(57) ABSTRACT

An electrochemical generator comprises a stack of cells in series. To control the voltage across the terminals, controlling means comprise, for each cell, a first reactive passive component, the impedance varying depending on the DC voltage across its terminals, being biased by the voltage delivered by the cell, and a second reactive or resonant passive component forming, with the first reactive passive component, a series or parallel resonant circuit having a preset nominal resonant frequency for a nominal biasing voltage delivered by the cell. Using a variable frequency signal generator to supply the resonant circuits allows a detection circuit to detect resonant peak(s) across the terminals. The divergence between the resonant frequency corresponding to a detected peak and the nominal resonant frequency indicates the state of the associated cell. The frequency differences directly, for their part, provide information on the uniformity of the cells with respect to each other.

19 Claims, 6 Drawing Sheets

(51) Int. Cl.
*G01R 19/165* (2006.01)
*H01M 10/48* (2006.01)
*H01M 8/04* (2006.01)

(52) U.S. Cl.
CPC ....... *G01R31/3679* (2013.01); *H01M 8/04552* (2013.01); *H01M 8/04873* (2013.01); *H01M 10/482* (2013.01); *H01M 10/486* (2013.01); *H01M 8/0432* (2013.01); *Y02E 60/50* (2013.01)

(56) References Cited

U.S. PATENT DOCUMENTS 8,581,547 B2 * 11/2013 Hoff ...................... H02J 7/0081
 320/116
2007/0080664 A1 * 4/2007 Maguire ............... H02J 7/0014
 320/116

* cited by examiner

DEVICE FOR MONITORING THE VOLTAGE OUTPUT BY THE CELLS OF AN ELECTROCHEMICAL GENERATOR

CROSS-REFERENCE TO RELATED APPLICATIONS

This application is a National Stage of International patent application PCT/EP2012/059468, filed on May 22, 2012, which claims priority to foreign French patent application No. FR 1155089, filed on Jun. 10, 2011, the disclosures of which are incorporated by reference in their entirety.

TECHNICAL FIELD

The invention relates to monitoring of the voltage delivered by the elementary cells of electrochemical generators, allowing their operating state to be controlled.

PRIOR ART

Electrochemical generators are conventionally made up of a stack of multiple cells in series. This is because an elementary cell cannot deliver an output voltage of a sufficient level to be exploitable as an energy source in an industrial or mass-market electrical appliance: a fuel cell is capable of providing a voltage comprised between 0.4 volts and 1.2 volts, depending on the nature of the cell, and notably depending on the fuel and oxidant used, and on the electrical current delivered, which depends mainly on the load; a battery cell is capable of delivering a voltage comprised between 1.2 volts and 3.8 volts, depending on the state of charge of the cell, on its temperature, and on the electrical current delivered.

Stacking cells in series allows their outputs to be added to obtain an output voltage that makes these generators exploitable as power sources in the electrical systems of various mass-market or industrial applications. These may range from systems for supplying electrical power for recharging portable devices (phones, computers), to systems for supplying electrical power to vehicle-borne power systems, electric vehicle drive systems for example. Mention may also be made, by way of an industrial application of these generators, of (electrical or gas) power storage stations.

In all these applications it is necessary to be able to guarantee the specified performance of the electrochemical generator (current/voltage characteristics) over the entire lifetime of the system in question.

Thus, it is necessary, in practice, to monitor the voltage delivered by each cell of an electrochemical generator since degradation of the performance of one cell in the stack will directly affect the performance of the generator, and may also reversibly or irreversibly degrade or prematurely deteriorate all or some of the cells.

Thus, monitoring means allowing the variation in the voltages across the terminals of each cell to be monitored over time are conventionally provided. Comparing these measurements with nominal performance allows any variations to be detected, and thus allows an indication to be obtained of the state of health of each cell of the generator, and its ageing.

Some variations are due to operating conditions, such as the electrical current delivered or temperature, and to natural ageing of the cells: the variation of each of the cells is then comparable. However, some voltage variations are due to defects in certain cells, which, if no action is taken, may lead to premature ageing, or even complete deterioration, of one or more cells. For example, when the state of charge of one battery cell is different to that of the other cells, it may lead to overcharging or to nearly complete discharge of this cell or eventually other cells, and to their premature ageing. In another example, when one cell of the fuel-cell stack is subjected to a momentary perturbation, for example due to poor evacuation of the water generated by the electrochemical reaction, or to a lack of fuel or oxidant on catalyst sites, the voltage of the cell may temporarily decrease. If it decreases below a characteristic voltage threshold, the cell may generate heat, which may deteriorate it irreversibly.

Thus, all of the information obtained by measuring and analyzing the variation in the voltage across the terminals of each cell over time makes it possible to determine whether it is operating normally or not. More generally, this information allows the performance of the electrochemical generator to be checked.

Means for measuring the voltage across the terminals of each cell, and signal shaping and processing means allowing the measurements to be analyzed, are required if the variation in the output voltage of the cells is to be measured and analyzed, i.e. in order to obtain information on whether they are operating correctly.

However, the compactness of these electrochemical generators is often such that the connection density therein is very high, which makes it difficult or even impractical to measure the voltages across the terminals of the cells.

The prior art contains various technological solutions for monitoring the voltages delivered by the multiple cells of an electrochemical generator. These solutions may be divided into two main families:

External solutions, which use a measurement board that is connected, via a robust wired connector designed for this purpose, to the generator. The measurement board contains one or more sensors, depending on whether all the measurements are carried out in parallel or one after the other, and means for transmitting signals to analysis tools typically comprising signal processing means. In these solutions, because of the compactness of the generators, connection is a major technological difficulty. Thus, the wired connector must be specially designed to ensure its contacts to the measurement board are reliable and robust. In practice, the design of these connectors is very dependent on the mechanical design of the electrochemical generator in question. Moreover, it may prove to be difficult to guarantee the quality of the electrical contacts over time, under the normal operating conditions of a mass-market or industrial appliance, and over the entire lifetime of the appliance. These monitoring solutions are more particularly difficult to implement in generators, intended for power applications, that consist of many cells in a very compact stack, notably fuel-cell stacks: the risk of a short-circuit between two measurement wires, and the risk of a measurement wire disconnecting or breaking, being particularly high in such stacks.

Solutions using a circuit, integrated into the generator, that comprises means for measuring voltage across the terminals of the cells, associated with contactless means for transmitting, via radio waves, measured information to external analyzing means. These integrated solutions have the major drawback of generally being more expensive than wired solutions.

Moreover, these various solutions generally require a regulated voltage source, which may cause the cells of the generator to discharge nonuniformly. Furthermore, in the case of the electrochemical generators used in vehicle-borne power systems, electrical standards currently in force require the power circuit and the control circuit to be isolated by a highdielectric-withstand electrical isolation. A suitable galvanic isolation must therefore be provided, which may be very constraining for certain voltage measurement techniques.

SUMMARY OF THE INVENTION

One objective of the invention is to provide an alternative solution for monitoring the state of the cells of an electrochemical generator, which solution is inexpensive, simple to implement, even in vehicle-borne power systems, and reliable over time.

Contrary to prior-art technological solutions which all rely on direct measurement of the voltage across the terminals of the cells, it is proposed to measure this voltage indirectly.

The idea behind the invention is based on the use of a resonant circuit comprising a reactive passive component biased by the voltage delivered by a cell, and the impedance of which varies depending on the DC voltage across its terminals. A variation in the voltage delivered by a cell then causes the resonant frequency of the associated resonant circuit to vary. This transformation to the frequency domain allows connection to be simplified and considerably reduces all the associated risks of malfunction. It also simplifies galvanic isolation of vehicle-borne power systems. Another advantage is that the measurement is a passive measurement because it requires very little current, which increases the reliability, the compactness and the robustness of the proposed monitoring system.

More precisely, according to the invention an electrochemical generator is provided composed of at least one stack of multiple cells electrically connected in series, and provided with means for controlling the voltage across the terminals of these cells, characterized in that the controlling means comprise:

for each cell to be controlled,
  a first reactive passive component the impedance of which varies depending on the DC voltage across its terminals, this component being supplied with the voltage of at least one cell to be controlled, and
  at least one second reactive passive component forming, with the first reactive passive component, a series or parallel resonant circuit having a preset nominal resonant frequency for a nominal voltage provided by the cell,
a variable frequency signal generator supplying the bank of resonant circuits, and
a means for detecting the position of the resonant peak(s) of the bank thus supplied, this means providing an indication of a divergence between a resonant frequency corresponding to a detected peak and a nominal resonant frequency.

In one embodiment, the resonant circuits are connected in series, and the first reactive passive component of a resonant circuit is biased by the voltage delivered by one cell.

The first reactive component is advantageously a varicap diode and the second reactive passive component is either an inductor or a resonant circuit, such as a quartz crystal for example.

In a first operating configuration of the invention, the resonant circuits corresponding to various cells have different nominal resonant frequencies.

The detecting means then detects various resonant peaks, corresponding to the various cells. Thus, by detecting the positions of the resonant peaks in a signal measured across the terminals of the bank of resonant circuits, it is possible to obtain information on the state of each of the cells of the stack.

In one embodiment of the invention, the resonant circuits are supplied by the generator via a wired connection.

In another embodiment of the invention, the resonant circuits are supplied by the generator via an isolating transformer.

In one variant, whereas the resonant circuits are excited via wires, the measure/detection of the voltage signal uses radio-frequency means.

In another variant, excitation of the resonant circuits and the measure/detection of the voltage signal use radio-frequency means.

BRIEF DESCRIPTION OF THE DRAWINGS

Other features and advantages of the invention will become apparent on reading the following detailed description, which is given with reference to the appended drawings, in which.

DETAILED DESCRIPTION OF THE INVENTION

Figure 1:
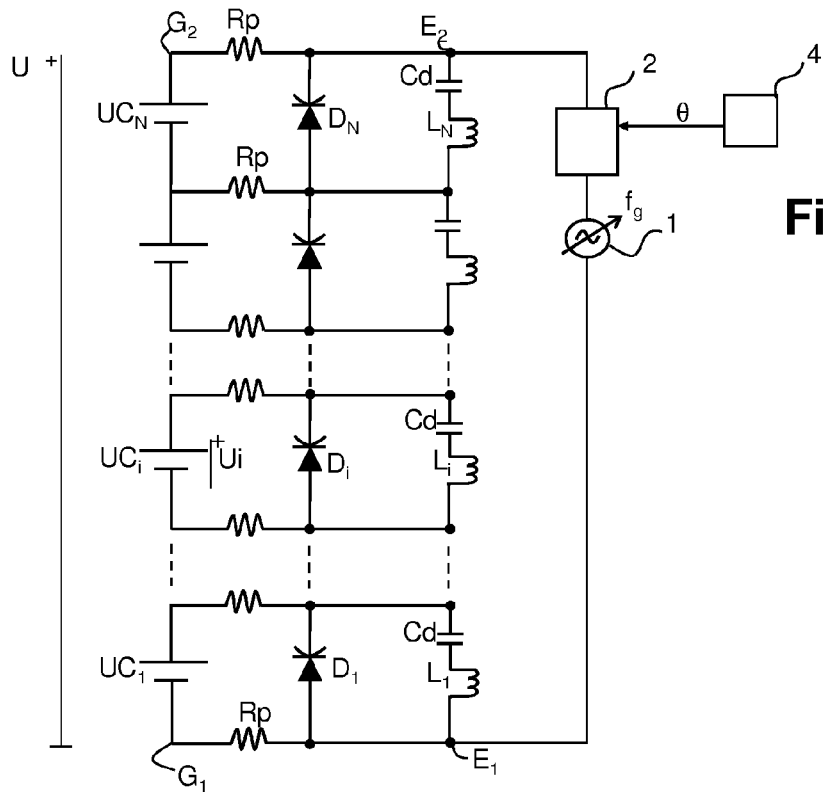
FIG. 1 shows a circuit for controlling the voltage of cells in a stack of cells in an electrochemical generator, in a first embodiment in which the resonant circuits are parallel resonant circuits and are placed in series.

A first embodiment of a control circuit according to the invention is illustrated in FIG. 1, applied to a stack of N cells $UC_i$, of an electrochemical generator. Each cell $UC_i$, delivers, across its terminals, an elementary DC voltage Ui. Across the terminals $G_1$, $G_2$ of the stack a voltage U equal to the sum of the N elementary DC voltages Ui is obtained.

The control circuit comprises one resonant circuit per cell $UC_i$. The resonant circuit comprises a first reactive passive component $D_i$ and a second reactive passive component $L_i$, connected to the terminals of each cell $UC_i$. The bank of resonant circuits are placed in series. The first reactive passive component is preferably a varicap diode, and the second reactive passive component an inductor. They are each connected in parallel to the cell $UC_i$, as illustrated, forming a parallel LC resonant circuit with the capacitance $C_i$ of the varicap diode and the inductance of the inductor $L_i$. Since the cell $UC_i$ ensures the function of biasing the varicap diode with voltage, the capacitance value $C_i$ of the diode reflects the voltage level Ui delivered by the cell $UC_i$. Thus, measuring the resonant frequency of the resonant circuit ($L_i$, $D_i$) is a way of indirectly measuring the voltage delivered by the cell $UC_i$.

Figure 3:
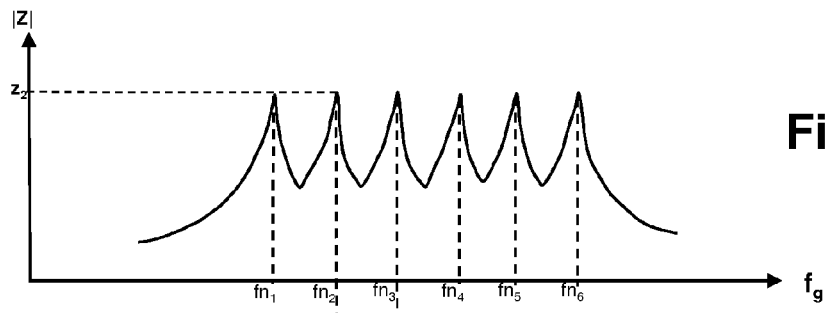
FIG. 3 shows the shape of the curve $|Z|=g(f_g)$ of the variation in the impedance across the terminals of the bank of resonant circuits in the control circuit shown in FIG. 1 or 2, with the frequency $f_g$ of the excitation signal of the generator, for resonant circuits centered on different nominal resonant frequencies, and for cells all delivering a nominal voltage.

This indirect measurement is made using means for exciting/detecting the resonant circuits, comprising a variable frequency $f_g$ signal generator 1 for supplying the bank of resonant circuits, and a means 2 for detecting the position of the resonant peaks: when the frequency $f_g$ of the signal delivered by the generator corresponds to the resonant frequency $f_g$ of a resonant circuit ($D_i$, $L_i$), a resonant peak, corresponding to the resonant circuit in question being excited to oscillate, will appear on the curve $|Z|=g(f_g)$ (FIG. 3). This excitation/detection circuit is very symbolically shown in the figures by a rectangle representing a detection circuit 2 in series with a circle representing the variable frequency excitation signal generator, this assembly being placed parallel to the terminals $E_1$ and $E_2$ of the bank of resonant circuits.

Preferably, and as illustrated, for each of the resonant circuits at least one decoupling capacitor Cd is provided, placed in series with the inductor $L_i$, this series assembly itself being placed in parallel with the varicap diode Di. These decoupling capacitors allow the inductors $L_i$ to be isolated from the DC voltage delivered by the cells.

In the example illustrated in FIG. 1, there are thus N decoupling capacitors Cd, one per resonant circuit.

Figure 2:
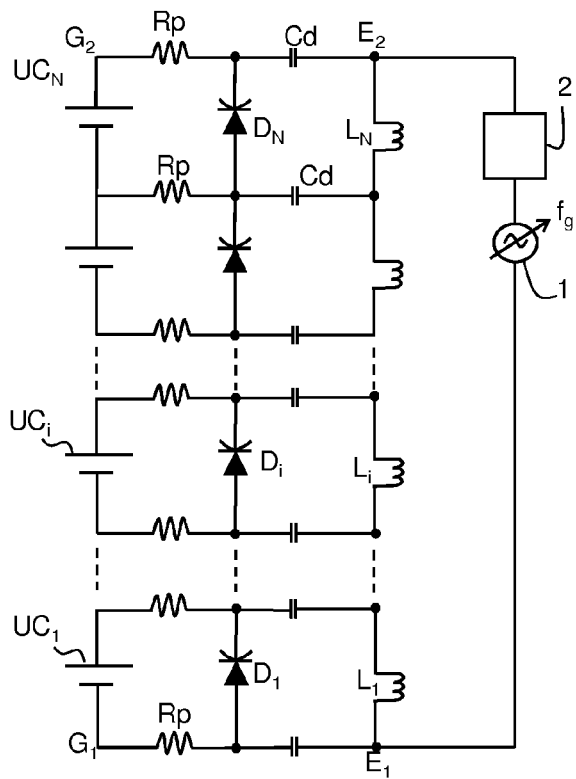
FIG. 2 shows a variant of this control circuit.

In a variant illustrated in FIG. 2, pairs of resonant circuits share a decoupling capacitor Cd. This arrangement makes it possible to provide, with N+1 decoupling capacitors Cd, two decoupling capacitors Cd per resonant circuit, one decoupling capacitor Cd being placed on each side of the corresponding cell $UC_i$.

Each varicap diode may be directly biased by the voltage delivered by the associated cell $UC_i$, or, as illustrated in FIGS. 1 and 2, via resistors Rp. In the example, a resistor Rp is placed in series between each terminal of the cell $UC_i$ and the associated varicap diode. For N cells, N+1 resistors Rp are used, pairs of cells sharing a given decoupling resistor.

This resistor Rp allows the biasing circuit of the varicap diode $D_i$, comprising the cell $UC_i$ and the varicap diode $D_i$, to be decoupled from the resonant circuit formed by the varicap diode $D_i$ and the inductor $L_i$, in the small-signal AC regime. In practice, this resistor has a high resistance of about $10^6$ ohms, which does not affect the biasing circuit since the reverse-bias current of the diode is almost zero.

Any variation in the elementary voltage $UC_i$ delivered across the terminals of a cell will result in a variation in the capacitance of the varicap diode, and therefore in a variation in the resonant frequency of the resonant circuit ($D_i$, $L_i$) associated with the cell.

Detection of this variation is exploited in the invention to gather information on the state of cells.

Figure 4:
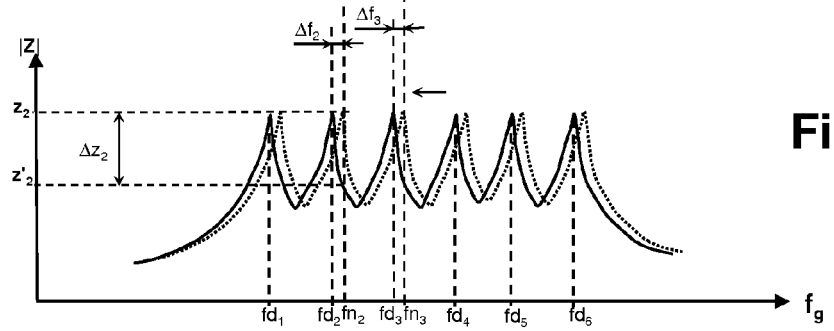
FIG. 4 shows a deviation of this curve $|Z|=g(f_g)$ illustrating the case of uniform drift in the cells of the stack.
Figure 5:
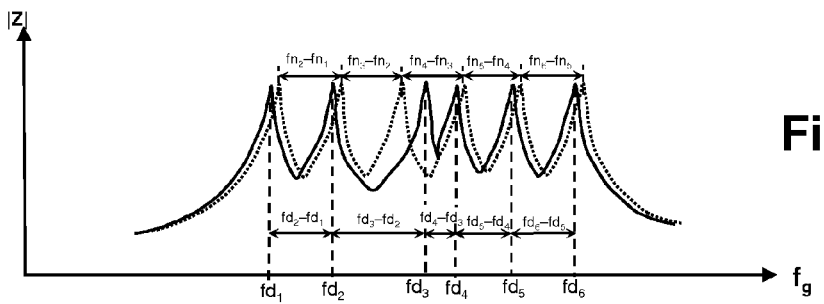
FIG. 5 shows the shape of a curve $|Z|=g(f_g)$ illustrating the case of a defective cell in the stack.

The detection principle is illustrated in FIGS. 3 to 5. A stack of N=6 cells, with an implementation of the invention in which the N=6 resonant circuits associated with the cells have different nominal resonant frequencies, denoted $fn_1$ to $fn_6$, is taken as an example. Typically, the properties of the varicap diodes and the inductors of each of the resonant circuits are chosen so that, for a nominal voltage across the terminals of each of the cells, the various desired nominal resonant frequencies are obtained with the best possible Q factor, thereby promoting precise detection of the position of the resonant peaks.

The detection circuit 2 allows the level of the modulus |Z| of the impedance (or the impedance level for the sake of simplicity) across the terminals $E_1$ and $E_2$ of the bank of N resonant circuits, to be evaluated. This impedance evaluation is carried out in the conventional way by measuring voltage and/or current across the terminals $E_1$ and $E_2$, and as a function of the electrical characteristics of the excitation signal emitted by the generator 1 used, there being no need to describe this evaluation technique in detail.

Since the nominal resonant frequencies $fn_1$ to $fn_6$ are offset, the curve of the variation of this impedance with the frequency $f_g$ of the generator 1 comprises N offset resonant peaks. Since the resonant circuits are parallel LC resonant circuits, each resonant peak corresponds to an impedance maxima obtained at a frequency $f_g$ equal to the corresponding nominal resonant frequency. The curve $|Z|=g(f_g)$ across the terminals of the bank of resonant circuits thus has the shape shown in FIG. 3.

In the case of normal uniform ageing of the cells of the stack, causing the current delivered by the electrochemical generator to gradually change, or in the case of a variation in the average temperature of the electrochemical generator, the voltages delivered by the cells vary over time in substantially the same way: the resonant frequencies of the resonant circuits will then change over time in substantially the same way, undergoing a substantially uniform translation, i.e. without substantial deformation of the curve. This is what FIG. 4 illustrates: the dotted curve is the nominal curve measured at a time $t_0$; and the solid curve is the new curve measured at a time t.

In the case where the voltage drops across just one cell, only the resonant frequency of the associated resonant circuit will shift: on the curve $|Z|=g(f)$, the corresponding resonant peak will move closer to an adjacent resonant peak, modifying the general shape of the curve, as illustrated in FIG. 5.

Thus, measurement of the curves $|Z|=g(f)$ over time allows the state of the cells of the stack to be monitored.

In practice, it is possible to exploit these curves in various ways to obtain information on the state of the cells.

It is worthwhile noting that the position of the detected resonant peaks makes it possible to determine the absolute value of the voltage delivered across the terminals of each cell. Each detected resonant peak corresponds to a given resonant circuit and therefore to a given cell. Thus, the position of a resonant peak provides the resonant frequency $fd_i$ of the corresponding resonant circuit. Since, the inductances of the inductors of the resonant circuits are known, this resonant frequency $fd_i$ allows the value $C_i$ of the capacitance of the varicap diode $D_i$ of the resonant circuit to be calculated ($fd_i = 1/2\pi(L_i.C_i)^{1/2}$ and thus the voltage Ui delivered by the cell to be determined using the characteristic capacitance/voltage curve of the varicap diode.

However, the invention allows the resonant frequency measurements to be directly exploited to obtain information on the state of the cells, without it being necessary to determine the voltage delivered by each cell.

In a first implementation, the absolute information provided by the position of each detected resonant peak is used to obtain an indication of the state of a corresponding cell. This implementation thus consists in evaluating the divergence of each resonant peak from its nominal position.

This may be done by measuring, for each detected resonant peak, the divergence between the corresponding resonant frequency and the nominal resonant frequency. Thus, $\Delta f_2$ and $\Delta f_3$ in FIG. 4 illustrate two divergences from nominal frequency.

As a variant, it is also possible to evaluate an impedance divergence $\Delta|Z|$. It is then a question of evaluating, for each resonant circuit, the divergence between the impedance level detected for a frequency $f_g$ equal to the nominal resonant frequency of the resonant circuit, and the nominal level of this impedance, i.e. that given by the "nominal" curve in FIG. 3.

This measurement is illustrated in FIG. 4, in which the solid curve is a measured curve, and the dotted curve is the nominal curve. For the nominal resonant frequency $fn_2$: the nominal value of the impedance across the terminals of the bank of resonant circuits, at this nominal resonant frequency $fn_2$, is z2. It is compared with the value z'2 of the impedance, at the same resonant frequency fn2, on the measured curve. The impedance divergence $\Delta z_2$ results in a variation in the position of the resonant peak of the corresponding resonant circuit.

Comparison of these frequency or impedance divergences with preset thresholds may advantageously provide an indication of whether a threshold has been violated. It is thus possible to determine whether a cell is faulty, but still viable, or permanently degraded.

In another implementation, which may replace or complement the first, the offset between successive resonant peaks, i.e. the differences $fd_{i+1} - fd_i$, is measured, which, rather than giving an indication of the state of each cell, provides a quantitative indication of the relative uniformity of the cells with respect to each other. Simplistically, if the general shape of the curve does not change over time, as in the case illustrated in FIG. 4, this indicates a uniform change, which corresponds to a uniform change in the voltages delivered by the cells. To improve the precision of the device, it is possible to correlate the indications obtained from the curves with information obtained from other sensors: for example a sensor 4 delivering a measurement of the voltage U across the terminals of the N cells of the stack and/or another sensor 3 locally measuring the temperature $\theta$ in the generator.

In practice, it is then sought to detect whether there is an anomaly in the offset between two successive detected resonant peaks, relative to their offset under nominal conditions. This is what is illustrated in FIG. 5. The measurement of the offset between two successive peaks is given by the difference between the corresponding resonant frequencies, to be compared to the difference between the nominal resonant frequencies. For example, in FIG. 5, it may be seen that the offset equal to $fd_4 - fd_3$ between the 3rd and 4th detected peaks is different to the nominal offset equal to $fn_4 - fn_3$. FIG. 5 thus shows an offset anomaly between the 2nd peak and the 3rd peak, between the 3rd peak and the 4th peak, and between the 4th peak and the 5th peak, resulting from a nonuniform change in the cells.

Figure 6:
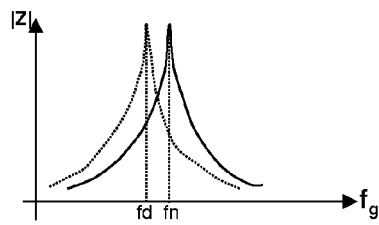
FIGS. 6 and 7 show curves $|Z|=g(f_g)$, obtained for an example embodiment of the circuit shown in FIG. 1 or 2, in which all the resonant circuits are centered on the same nominal resonant frequency, FIG. 6 illustrating two curves, the solid curve corresponding to a nominal operation of the cells, and the other dotted curve showing a uniform variation in all the cells, and FIG. 7 showing a defect attributable to at least one cell of the stack.
Figure 7:
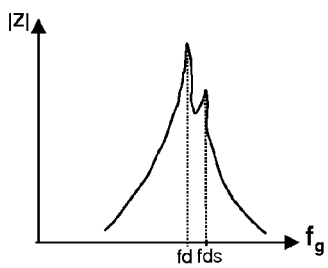

FIGS. 6 and 7 illustrate a variant embodiment of the control circuit according to the invention, which is simpler to implement, the resonant circuits being produced with identical components so that they are all centered on the same nominal resonant frequency fn. The curve of the variation in impedance with the frequency of the signal from the generator 1 then has the shape of the solid curve illustrated in FIG. 6, centered on the nominal resonant frequency fn. Over time, or depending on the operating conditions, for example temperature or the delivered current, the state of the cells may undergo a uniform change: a curve centered on a different resonant frequency fd, but of identical general shape, as illustrated by the dotted curve in FIG. 6, is obtained.

In the case of a defect specific to at least one cell, the impedance curve will deform and at least one secondary impedance peak centered on a "secondary" resonant frequency fds will appear in addition to a central peak centered on a main resonant frequency fd. Detection of one or more secondary peaks is an indication of a nonuniform change in the cells of the stack. The higher the Q factor of the resonant peaks, the easier detection of any deformation will be.

This embodiment is simpler to implement since it uses resonant circuits that are all identical. It may be used when it is only sought to monitor changes in all of the cells. Advantageously, it will possibly be coupled with measurement of the voltage across the terminals $G_1$, $G_2$ of the N cells of the stack and/or of the average temperature of the generator.

By way of a realistic illustration of the invention, an electrochemical PEMFC (proton exchange membrane fuel cell or polymer electrolyte membrane fuel cell) generator was simulated. The stack simulated consisted of 8 PEMFC cells.

The control circuit must be defined in correspondence with the electrical characteristics of these cells, the terminal voltage of which may vary from 0.4 volts, which is the lower voltage limit below which there is a risk of heat generation or destruction of a cell, to 1 volt, which is the open-circuit voltage of the cell. The varicap diode of manufacturer reference BB202, which is a widely used mass-market CMS electronic component, is well suited to monitoring this voltage range. This is because its capacitance varies very significantly, from 30 picofarads to about 15 picofarads, with reverse-bias voltage when the latter passes from 0.3 volts to 1.5 volts, thus enabling precision detection in this operating range. Thus, this varicap diode may be used in each of the resonant circuits.

A control circuit embodiment using resonant circuits centered on different resonant frequencies was chosen. It was therefore necessary to vary the inductance of the inductor $L_i$ from one resonant circuit to another. CMS inductors of manufacturer reference ATC 1008 WL with inductances of 100 nH, 150 nH, 220 nH, 330 nH, 470 nH, 680 nH, 1000 nH, and 1500 nanohenries, respectively, were employed for the reactive components $L_1, L_2, L_3, L_4, L_5, L_6, L_7, L_8$ of the eight resonant circuits.

The proposed inductive components have satisfactory Q factors, typically 60 for $L_1$ and 28 for $L_8$.

In the simulation, the decoupling resistors Rp, decoupling capacitors Cd, cabling impedances, and the Q factor of each of the inductive components were simulated by a resistor of appropriate resistance in parallel with each resonant circuit.

FIGS. 8 to 12 illustrate the curves $|Z|=g(f_g)$ obtained.

Figure 8:
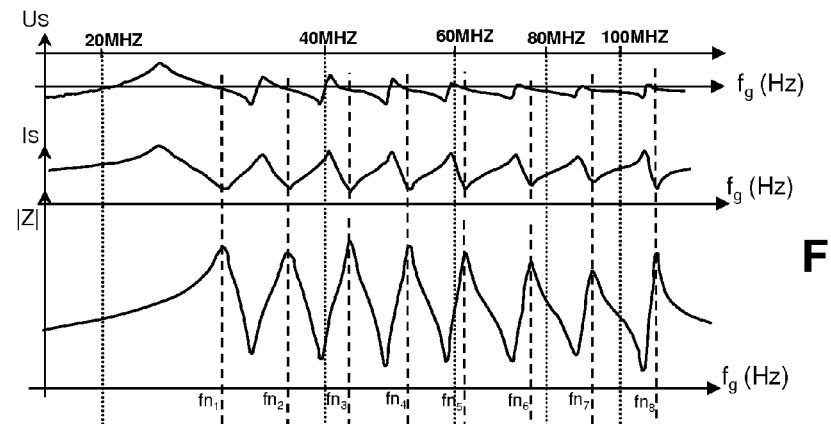
FIG. 8 illustrates three curves, of the voltage, current and impedance measured across the terminals of a stack as a function of frequency, obtained by simulation for a stack of 8 electrochemical cells, and in an example embodiment with resonant circuits centered on different nominal resonant frequencies.

The curve $|Z|=g(f)$ illustrated in FIG. 8 (logarithmic scale frequency axis) is the nominal curve obtained for cells each delivering a nominal voltage of 1 volt, this voltage being applied as a reverse-bias voltage to the varicap diode of each of the eight resonant circuits. In practice this curve is obtained by measurement, by the detection circuit 2, of the voltage and the current across the terminals of the bank of resonant circuits, as a function of the frequency of the excitation signal emitted by the frequency generator 1.

Eight resonant peaks are obtained, the positions of which give the nominal resonant frequencies $fn_1$ to $fn_8$, which, in the example, are equal to 28.93 MHz, 35.54 MHz, 43.12 MHz, 51.88 MHz, 61.94 MHz, 75.92 MHz, 92.05 MHz and 112.46 MHz, respectively.

Curves of the current Is and voltage Us measured across the terminals of the bank of resonant circuits, as a function of frequency $f_g$, are also shown in FIG. 8.

Curves 9 to 12 are curves of the impedance variation with the excitation frequency of the frequency generator 1, reflecting the situation of the generator in certain circumstances. They either show a uniform cell behavior, or nonuniform behaviors revealing faults in one or more cells, or a general failure of all the cells.

Figure 9:
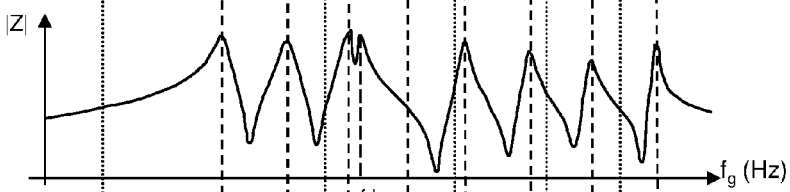
FIGS. 9 to 12 illustrate the impedance curves in FIG. 8, obtained by simulation, reflecting how the 8 cells of the stack vary over time.

More specifically, the curve in FIG. 9 shows a fault in the 4th cell, the corresponding resonant peak clearly being "shifted" relative to the others. More precisely, the positions of the detected resonant peaks give resonant frequencies $fd_1$ to $fd_8$ equal to 28.93 MHz, 35.51 MHz, 43.05 MHz, 44.7 MHz, 61.94 MHz, 75.92 MHz, 92.05 MHz, and 112.46 MHz, respectively: thus all the detected resonant frequencies are equal to or very close to their nominal value, except $fd_4$ which is markedly different, by 7.18 MHz. In the example simulated, this frequency $fd_4$ corresponds to a voltage of 0.4 volts being delivered by the corresponding cell. Thus, by defining a threshold of 7 MHz for this cell, it is possible to detect a threshold violation, corresponding to the low voltage limit of the cell, using the divergence between the detected resonant frequency $fd_4$ and the nominal frequency $fn_4$.

Figure 10:
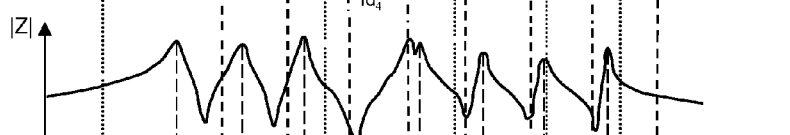

The curve in FIG. 10 shows another situation in which only the 4th cell corresponds to a nominal operating state (with a detected resonant frequency $fd_4$ equal to its nominal resonant frequency $fn_4$) whereas, for the other cells, the positions of the detected resonant peaks give resonant frequencies that are very different from their nominal values, the detected peaks corresponding to simulation conditions under which these cells each provide a voltage of 0.4 volts. In the example, $fd_1$ equals 24.87 MHz, $fd_2$ equals 30.53 MHz, $fd_3$ equals 37.04 MHz, $fd_5$ equals 53.33 MHz, $fd_6$ equals 65.26 MHz, $fd_7$ equals 79.07 MHz and $fd_8$ equals 96.6 MHz. Measuring the divergence of the detected resonant frequency from its nominal value, and/or comparing this divergence to a threshold corresponding to the lower voltage limit, thus allows the individual state of each cell to be determined. In the example, it would be discovered that the cell 4 is operating in a nominal way whereas all the others are faulty. Measuring the divergence between two successive detected peaks and comparing it to a nominal divergence value would give an indication of nonuniform cell behavior.

Figure 11:
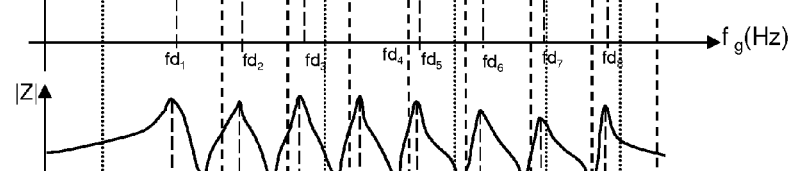

FIG. 11 corresponds to a simulation in which all the cells are faulty, delivering to their terminals a voltage of only 0.4 volts: the curve obtained is uniform on the whole but offset in frequency relative to FIG. 8. As above it is possible to evaluate the state of each of the cells by considering the resonant frequency of each detected peak and/or the uniform or non-uniform behavior of the cells by considering the offset between the detected peaks.

Figure 12:
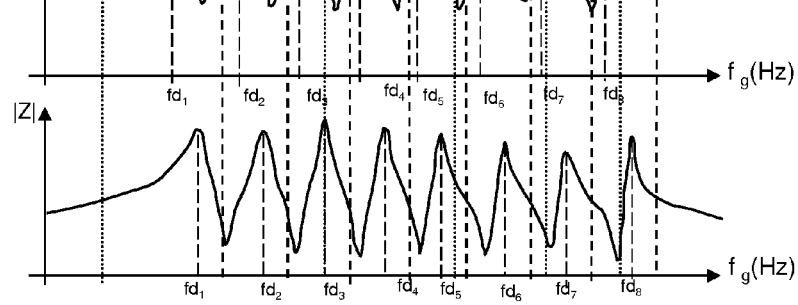

Lastly, FIG. 12 illustrates an intermediary situation to that in FIG. 11, each of the cells delivering a uniform voltage of 0.7 volts. The curve shows a uniform change, but with smaller frequency divergences, the detected resonant frequencies $fd_1$ to $fd_8$ here being equal to 26.87 MHz, 33.01 MHz, 40.06 MHz, 48.19 MHz, 57.54 MHz, 70.52 MHz, 85.51 MHz, and 104.47 MHz, respectively. The various measurements carried out according to the invention, based on the positions of the detected resonant peaks, could show that each cell is worse and/or that each cell is worse but not completely faulty (threshold not exceeded) and/or a uniform behavior of the cells.

As indicated above, it is possible to make provision for the information obtained from these impedance variation curves to be coupled with other information such as, notably, the voltage U across the terminals of the stack of N cells, or even the average temperature θ of the generator.

Figure 13:
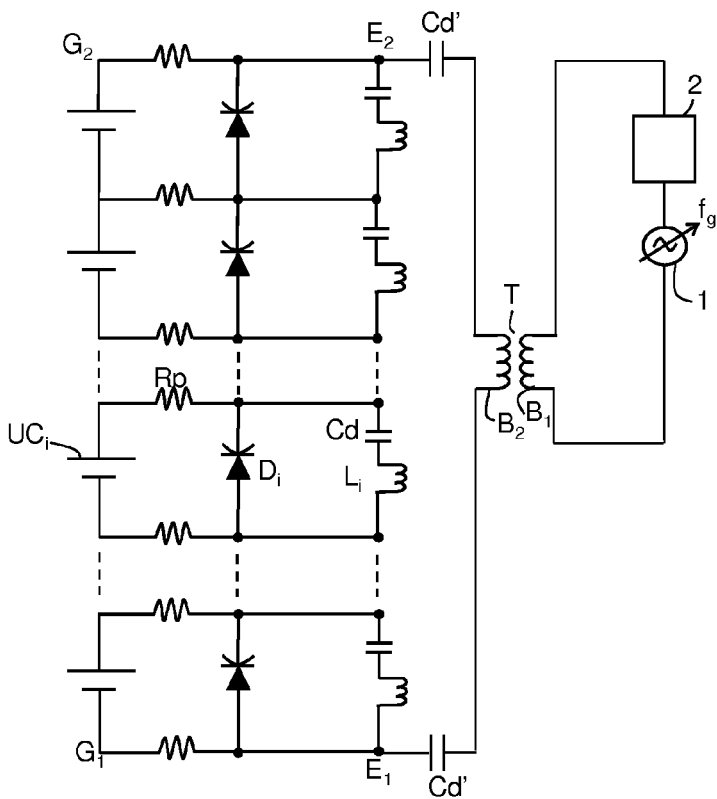
FIG. 13 shows an embodiment of a control circuit of the invention using an electromagnetic transformer to provide galvanic isolation.

The proposed invention may easily include a galvanic isolation. In the version illustrated in FIG. 13 a transformer T is provided, a secondary winding B2 of which supplies the resonant circuits ($L_i$, $D_i$). In the example illustrated, the secondary winding is connected to the terminals E1, E2 of the bank of resonant circuits via decoupling capacitors Cd', which are necessary in the illustrated configuration as the decoupling capacitors Cd are directly connected in series with each inductive component. The primary winding B1 is connected to the terminals of the series assembly of the generator 1 and the measuring circuit 2.

In the description just given, the components placed in parallel with the "varicap" components are inductors. It could advantageously be envisioned to replace these inductors with resonant circuits, these resonant circuits possibly allowing the complete resonant circuit to achieve a higher Q factor. For example, it could be envisioned to use components such as quartz crystals instead of the inductors $L_i$.

Other variants may also be envisioned. Notably the embodiments just described refer to an entirely wired method of implementation.

Figure 14:
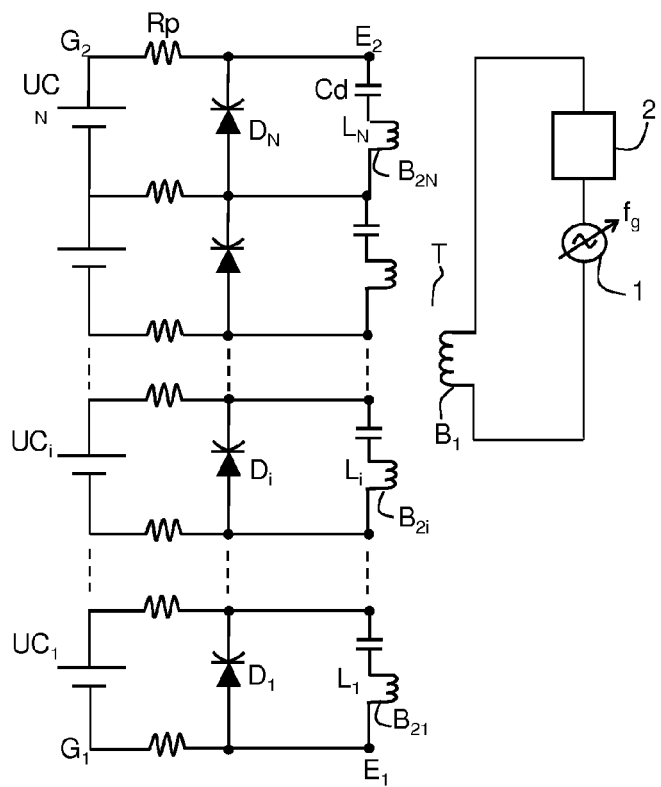
FIG. 14 shows an example embodiment of a control circuit of the invention, in which the excitation/detection are transmitted by (radio-frequency) electromagnetic waves and in which the inductive component of the resonant circuit is also the magnetic transmission antenna.
Figure 15:
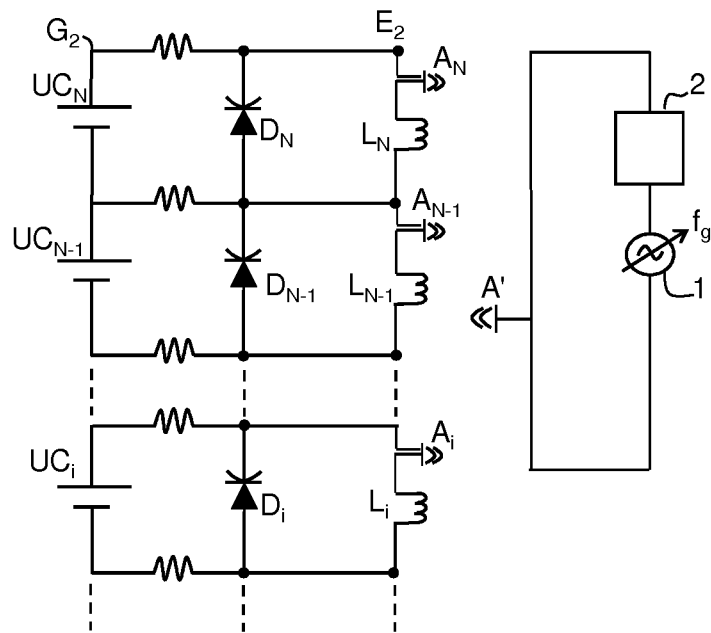
FIG. 15 shows a control circuit of the invention using radio frequencies to transmit signals via electrical antennae.
Figure 16:
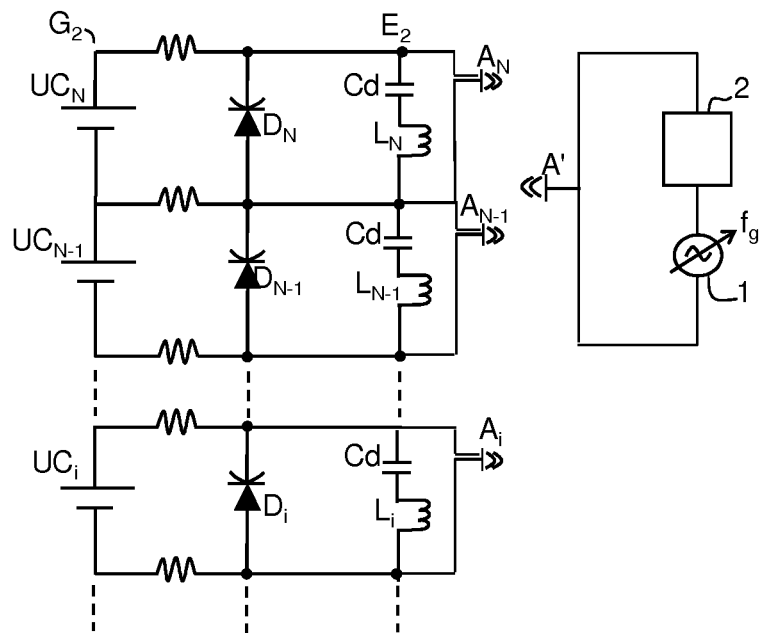
FIG. 16 shows a variant embodiment of the circuit in FIG. 15.

Partially wired versions may be envisioned: wired connection for the biasing of the resonant circuits by the cells, wireless connection for the frequency excitation and/or detection. FIGS. 14 to 16 are symbolic illustrations thereof.

As one variant, illustrated in FIG. 14, the secondary winding of the transformer T is made up of elementary windings $B_{2i}$ formed by the inductive antennae $L_i$ of the resonant circuits.

Another variant (not illustrated) may be envisioned in which the detecting means comprises a network of inductive antennae (forming a transformer T) for receiving an AC signal generated by the reactive components of the resonant circuits, which is the signature of the resonant circuits in the AC regime, the resonant circuits being supplied by the frequency generator via a wired connection, i.e. the frequency generator 1 is connected to the terminals $E_1$ and $E_2$ of the bank of resonant circuits by wires. This variant would allow the quality of the measurements carried out to be improved, while elementary voltage information would still be transmitted wirelessly.

FIGS. 15 and 16 illustrate another partially wired version, using radio-frequency electrical antennae. In this version, the resonant circuits each comprise a radio-frequency electrical antenna A excited by an electrical antenna A'. When the frequency $f_g$ corresponds to the resonant frequency of a resonant circuit associated with a cell, the equivalent impedance seen by the antenna A' sees an extremum. This variant may use the antenna of the detection circuit, as symbolized in FIGS. 15 and 16, or another antenna.

In the version in FIG. 15, each emissive radioelectric antenna is placed in series with the inductor $L_i$ of the associated resonant circuit and advantageously also provides the function of the decoupling capacitor Cd allowing the DC voltage component, which otherwise would be seen by the parasitic resistor of the inductor $L_i$ alone, to be suppressed. In the version in FIG. 16, the emissive radioelectric antenna is placed in parallel with the inductor $L_i$. Preferably, at least one decoupling capacitor Cd is then placed in series with the inductor, as explained with reference to FIGS. 1 and 2.

Figure 17:
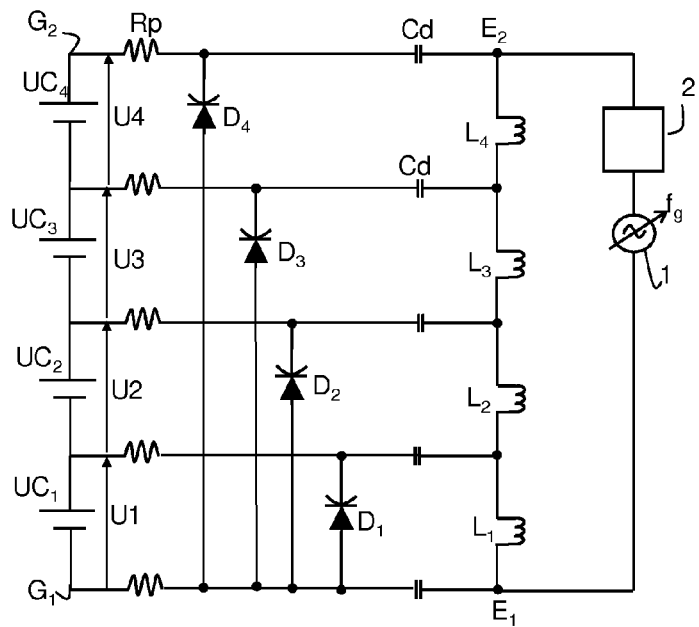
FIG. 17 shows a control circuit according to another embodiment, containing resonant circuits with an interleaved structure.

As for FIG. 17, it illustrates another variant embodiment of the resonant circuits, these circuits having an interleaved structure. Thus, in a stack of N cells of rank n=1 to N, the varicap diode $D_n$ of rank n is biased directly, or via resistors Rp as illustrated, by the voltage across the terminals of the n cells of rank 1 to n. The resonant circuit of rank n associated with the varicap diode $D_n$ contains the series bank of n inductors $L_1$ to $L_n$, in parallel across the varicap diode $D_n$, each inductor being in series in one of the n cells.

The diode $D_n$ is thus biased by the voltage delivered across the terminals of n cells, and the resonant circuit of the associated rank n allows the voltage U1+U2+ . . . Un across the terminals of the n cells of rank 1 to n to be monitored. Since the varicap diodes are all biased by different voltages, each will then have to be chosen to correspond to a different voltage range to be monitored.

In contrast, the structure allows N inductors with the same inductance to be used.

Exploiting the positions of the detected resonant peaks to determine the state of each elementary cell, on account of them being interleaved with the resonant circuits, will in practice be more complicated.

It will be noted that FIG. 17 illustrates an entirely wired implementation, and the presence of series decoupling capacitors shared by the adjacent resonant circuits. All the variants described, whether it is, notably, a matter of decoupling capacitors or partially wired versions, may apply to an interleaved structure of the resonant circuits. Lastly, the interleaved structure may interleave the varicap diodes, as illustrated. It may also interleave the inductors, or even the varicap diodes and the inductors.

Figure 18:
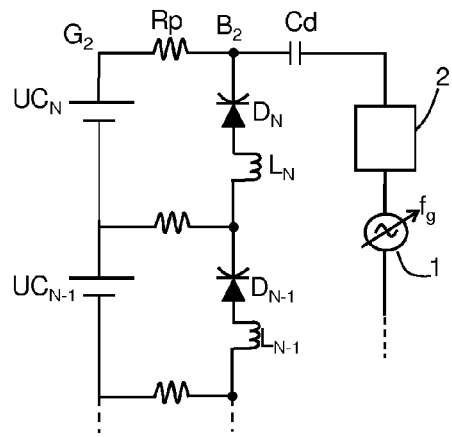
FIG. 18 shows a series variant of the resonant circuits in FIG. 1.
Figure 19:
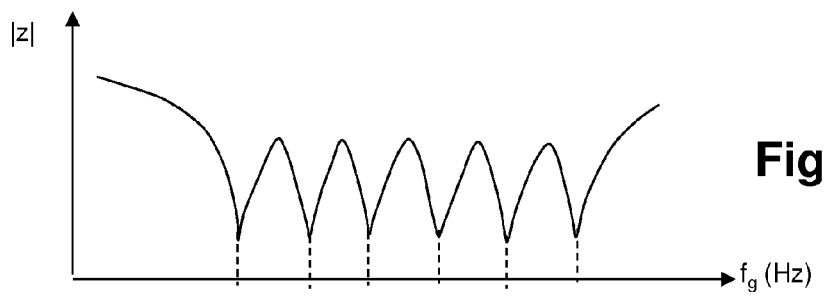
FIG. 19 illustrates the shape of the corresponding curve $|Z|=g(f_g)$.

FIGS. 18 and 19 illustrate another implementation of the invention, using series, rather than parallel, LC resonant circuits. The resonant peaks will then correspond to impedance minima, as illustrated in FIG. 19. The principles for exploiting the curves $|Z|=g(f_g)$ remain the same as those described with parallel LC resonant circuits.

It will be noted that certain applications, notably power applications, require an electrochemical generator comprising a very large number of cells, which may be combined into one integral stack or separated into packs of N successive cells. For these generators, and on account of the low measurement frequency required to monitor the cells, it is then entirely possible to envision monitoring groups of n cells, while using only a single excitation/detection circuit, by means of a multiplexed solution in which this excitation/detection circuit is connected in sequence and in succession to the terminals of the resonant circuits of each group of cells.

The invention just described thus provides a monitoring device comprising an entirely passive local circuit associated with each cell of a stack, and all these circuits are excited by one and the same external source, a variable frequency generator allowing the voltages of the cells to be measured via a continuous frequency sweep. The invention enables integration into an electrochemical generator and provides a considerable advantage in connection terms since only two measurement wires are necessary per electrochemical generator stack in a wired configuration, and it also enables a wireless implementation.

The invention claimed is:

1. An electrochemical generator composed of at least one stack of N cells electrically connected in series, and provided with means for controlling the voltage across the terminals of these cells, the controlling means comprising:
   for each cell to be controlled,
      first reactive passive component the impedance of which varies depending on the DC voltage across its terminals, said component being biased by the voltage delivered by the cell to be controlled or by a group of cells in series comprising the cell to be controlled, and
      at least one second reactive passive component forming, with the first reactive passive component, a series or parallel resonant circuit having a preset nominal resonant frequency for a nominal biasing voltage delivered by the cell or the group of cells,
   a variable frequency signal generator supplying the bank of N resonant circuits, and
   a means for detecting the position of the resonant peak(s) of the bank thus supplied, this means providing an indication of a divergence between a resonant frequency corresponding to a detected peak and a nominal resonant frequency.

2. The electrochemical generator as claimed in claim 1, in which the resonant circuits are placed in series, the first reactive passive component of each resonant circuit being supplied, directly or via resistors, with the voltage of a cell to be controlled.

3. The electrochemical generator as claimed in claim 1, in which the first reactive passive component is a varicap diode, and the second reactive passive component is an inductor.

4. The electrochemical generator as claimed in claim 1, in which the first reactive passive component is a varicap diode, and the second reactive passive component is a circuit having the features of a resonant circuit such as a quartz crystal.

5. The electrochemical generator as claimed in claim 1, in which the N resonant circuits have different nominal resonant frequencies.

6. The electrochemical generator as claimed in claim 1, in which the N resonant circuits have identical nominal resonant frequencies.

7. The electrochemical generator as claimed in claim 5, in which the means for detecting the position of the resonant peaks provides an indication of a divergence between the position of a detected resonant peak and a nominal position corresponding to the nominal resonant frequency of a resonant circuit.

8. The electrochemical generator as claimed in claim 7, in which the detecting means provides an indication of a violated threshold in the divergence between the position of a detected resonant peak and its nominal position.

9. The electrochemical generator as claimed claim 5, in which the detecting means provides a quantitative indication of the uniformity of the bank of cells by analyzing relative shifts between resonant peaks.

10. The electrochemical generator as claimed in claim 5, in which the means for detecting the position of the resonant peaks provides an indication of a divergence between an impedance level detected across the terminals of the bank of resonant circuits at a generator frequency equal to the nominal resonant frequency of a resonant circuit, and a nominal impedance level for the same frequency and for the nominal voltage provided by the corresponding cell.

11. The electrochemical generator as claimed in claim 10, in which the detecting means provides an indication of a violated threshold in the divergence between the detected impedance level and the nominal impedance level.

12. The electrochemical generator as claimed in claim 1, in which the resonant circuits are excited by the frequency generator via a wired connection to the terminals of the bank of resonant circuits.

13. The electrochemical generator as claimed in claim 12, in which the resonant circuits are supplied by the variable frequency signal generator via a transformer a secondary winding of which excites the resonant circuits.

14. The electrochemical generator as claimed in claim 1, in which the resonant circuits are excited by the variable frequency signal generator via a transformer that comprises secondary windings formed by the second reactive components of the resonant circuits.

15. The electrochemical generator as claimed in claim 12, in which the means for detecting the position of the resonant peaks comprises a transformer for receiving the signature of the resonant circuits in the AC regime.

16. The electrochemical generator as claimed in claim 1, in which the means for detecting the position of the resonant peaks comprises an array of inductive antennae for receiving the signature of the resonant circuits in the AC regime.

17. The electrochemical generator as claimed in claim 1, in which the resonant circuits each comprise an electrical antenna placed in series or parallel with each of the inductors of the resonant circuits, which emits a signal at the resonant frequency of the corresponding resonant circuit, and the detecting means comprises a radio-frequency electrical antenna for receiving the signal emitted by the antennae of the resonant circuits.

18. The electrochemical generator as claimed in claim 17, in which the electrical antennae of the resonant circuits are connected in series with the inductors and serve in a decoupling capacity in order to remove a DC voltage component in these inductors.

19. The electrochemical generator as claimed in claim 1, in which the information delivered by the device is associated with other measurements, such as a measurement of the total voltage across the terminals of the electrochemical generator or a local temperature measurement, in order to improve the precision of the measurements or detection thresholds.

* * * * *